US008490545B2

(12) United States Patent
Hall et al.

(10) Patent No.: US 8,490,545 B2
(45) Date of Patent: *Jul. 23, 2013

(54) PRINTING SCREENS, FRAMES THEREFOR AND PRINTING SCREEN UNITS

(75) Inventors: James Graham Hall, Ayrshire (GB); Fraser Shaw, Ayrshire (GB)

(73) Assignee: DEK Vectorguard Limited, Ayrshire (GB)

( * ) Notice: Subject to any disclaimer, the term of this patent is extended or adjusted under 35 U.S.C. 154(b) by 0 days.

This patent is subject to a terminal disclaimer.

(21) Appl. No.: 13/094,419

(22) Filed: Apr. 26, 2011

(65) Prior Publication Data

US 2011/0219967 A1   Sep. 15, 2011

Related U.S. Application Data

(62) Division of application No. 10/513,452, filed as application No. PCT/GB03/01858 on Apr. 30, 2003, now Pat. No. 8,069,783.

(30) Foreign Application Priority Data

May 2, 2002 (GB) .................................. 0210102.0
Oct. 29, 2002 (GB) .................................. 0225130.4

(51) Int. Cl.
*B05C 17/06* (2006.01)

(52) U.S. Cl.
USPC ... 101/127.1; 38/102.1; 38/102.8; 160/374.1; 160/381

(58) Field of Classification Search
USPC .... 101/114, 127, 127.1, 128.4, 129; 160/372, 160/374, 374.1, 380, 381; 38/102.1, 102.3, 38/102.4, 102.5, 102.8, 102.91
See application file for complete search history.

(56) References Cited

U.S. PATENT DOCUMENTS

| 2,218,451 | A | 10/1940 | Heyne |
| 3,280,731 | A | 10/1966 | Proskauer |
| 3,359,663 | A | 12/1967 | Black |
| 3,416,445 | A | 12/1968 | Krueger, Jr. |
| 3,482,343 | A | 12/1969 | Hamu |
| 5,076,162 | A | 12/1991 | Goin |

(Continued)

FOREIGN PATENT DOCUMENTS

| DE | 196 15 058 | 10/1997 |
| DE | 202 09 385 | 8/2002 |

(Continued)

OTHER PUBLICATIONS

International Search Report for corresponding application No. PCT/GB2003/01858 dated Apr. 30, 2003.

*Primary Examiner* — Ren Yan
(74) *Attorney, Agent, or Firm* — Renner, Otto, Boisselle & Sklar, LLP

(57) ABSTRACT

A printing screen unit including a printing screen having two pairs of opposite edges and a frame including interface members bonded to opposite edges of the printing screen and coupled together at corners of the frame, wherein the frame holds the printing screen in an untensioned state when no tension is applied thereto by external tensioning mechanisms separate to the frame, and the frame is substantially rigid when in the untensioned state, but allows for relative movement of the respective pairs of interface members by a tension applied by external tensioning mechanisms separate to the frame to tension the printing screen.

21 Claims, 13 Drawing Sheets

U.S. PATENT DOCUMENTS

| | | |
|---|---|---|
| 5,113,611 A | 5/1992 | Rosson |
| 5,136,797 A | 8/1992 | Hildebrandt |
| 5,327,828 A | 7/1994 | Barocas |
| 5,802,971 A * | 9/1998 | Hamu et al. ............ 101/127.1 |
| 5,819,651 A | 10/1998 | Zepic et al. |
| 5,979,312 A | 11/1999 | Williams |
| 6,427,588 B1 | 8/2002 | Kline |
| 2002/0148370 A1 | 10/2002 | Erdmann |
| 2005/0034614 A1 | 2/2005 | Kasuya |

FOREIGN PATENT DOCUMENTS

| | | |
|---|---|---|
| EP | 0029348 | 5/1981 |
| EP | 1308275 | 5/2003 |
| GB | 2 264 460 | 9/1993 |
| GB | 2292115 | 2/1996 |
| GB | 2 364 961 | 2/2002 |
| GB | 2371520 | 7/2002 |
| JP | 7-507243 | 8/1995 |
| JP | 9-187914 | 7/1997 |
| JP | 10-235832 | 9/1998 |
| WO | 93/25061 | 12/1993 |
| WO | 94/07697 | 4/1994 |
| WO | 94/26518 | 11/1994 |
| WO | 02/055304 | 7/2002 |
| WO | 02/058930 | 8/2002 |
| WO | 03/107727 | 12/2003 |

* cited by examiner

PRINTING SCREENS, FRAMES THEREFOR AND PRINTING SCREEN UNITS

This application is a division of U.S. patent application Ser. No. 10/513,452 filed Nov. 2, 2004 now U.S. Pat. No. 8,069, 783, which is a national phase of International Application No. PCT/GB03/01858 filed Apr. 30, 2003, which claims priority of United Kingdom Patent Application Nos. 0210102.0 filed May 2, 2002 and 0225130.4 filed Oct. 29, 2002, all of which applications are hereby incorporated herein by reference.

The present invention relates to printing screens, often alternatively referred to as stencils or masks, for use in the screen printing of workpieces, typically electronic substrates, such as circuit boards and components, frames therefor, and printing screen units.

In one known printing screen unit, the printing screen comprises a thin, stiff metal sheet, typically of stainless steel or brass, which includes a plurality of printing apertures which define a pattern for the printing of a printing medium, typically solder paste. The printing screen is mounted to a rectangular frame by a flexible, perforate sheet, typically a woven mesh of polypropylene or stainless steel strands, which acts to tension the printing screen.

Whilst the above-described printing screen unit has been well used, the unit does have a number of drawbacks, notably in being expensive to fabricate, and not allowing for the printing screen to be detached from the frame without permanently damaging the perforate sheet.

In another, more recent printing screen unit, the printing screen is a demountable printing screen which comprises a thin, stiff metal sheet, typically of stainless steel, which includes a plurality of printing apertures which define a pattern for the printing of a printing medium, typically solder paste, and a plurality of fixing apertures at opposite edges thereof. The printing screen is mounted to a frame by mechanical tensioning mechanisms which engage the fixing apertures in the printing screen and act to tension the printing screen, with the tensioning force typically being provided by hydraulic, pneumatic or spring means.

WO-A-93/25061 discloses one such printing screen unit in which the printing screen includes a plurality of elongate slots, as the fixing apertures, along each of opposite edges thereof, and the tensioning mechanisms each include a set of teeth which engage the slots at respective ones of the opposite edges of the printing screen to tension the printing screen, with the tensioning mechanisms being configured to draw respective ones of the opposite edges of the printing screen over respective supporting edges of the frame.

GB-A-2364961 discloses another such printing screen unit in which the printing screen includes a plurality of first, fixing apertures along each of opposite edges thereof which are engaged by respective tensioning mechanisms, and a plurality of second, flexing apertures along each of the opposite edges thereof which extend inwardly of the respective fixing apertures and provide for regions of increased flexibility, with the tensioning mechanisms being configured to draw respective ones of the opposite edges of the printing screen over respective supporting edges of the frame.

These printing screen units, in not requiring the permanent attachment of a printing screen to a frame, advantageously allow for printing screens to be stored separately and mounted on frames as and when required, thereby being cheaper and facilitating use.

These printing screen units do, however, still suffer from a number of significant drawbacks. In particular, the edges of the printing screens are required to be more flexible than the main body thereof, and, as such, are more prone to damage during handling and mounting. This is particularly the case as the printing screens are stored as unsupported sheets. Also, as the printing screens are very thin, typically having a thickness of from about 0.1 to 0.25 mm, the edges thereof are razor sharp, which can lead to personal injury to a user if not handled with utmost care. Further, the printing screens are restricted to being fabricated from materials which have the necessary strength to allow for direct tensioning by tensioning mechanisms. Yet further, the printing screens require specific manufacturing techniques, such as etching, electroforming and punching, and thereby limit the scope for mass fabrication.

It is therefore an aim of the present invention to provide a printing screen unit which at least partially overcomes the above-mentioned problems associated with existing printing screen units, and printing screens and frames for such printing screen units.

In one aspect, it is an aim of the present invention to provide a demountable printing screen which provides improved resistance to damage during handling and mounting.

In another aspect, it is an aim of the present invention to provide a demountable printing screen which is safer to handle.

In a further aspect, it is an aim of the present invention to provide a printing screen unit which allows for use of printing screens from a wide range of materials, including plastics.

In a yet further aspect, it is an aim of the present invention to provide a printing screen unit which can be manufactured cheaply and simply.

In one aspect the present invention provides a printing screen, comprising a sheet, at least sections of at least one pair of opposite edges of which are folded such as to define attachment elements.

Preferably, the attachment elements are each folded inwardly such as to enclose an acute angle with a major surface of the sheet.

In one embodiment at least ones of the attachment elements each comprise a plurality of projections spaced along a length thereof.

Preferably, the projections comprise rectangular projections.

Preferably, the projections of each attachment element define a castellated structure.

In another embodiment at least ones of the attachment elements each comprise a single, continuous attachment element, and the sheet includes a plurality of flexing apertures in spaced relation along each of the opposite edges thereof in zones overlapping fold lines of the respective folds.

In one embodiment the sheet has two pairs of opposite edges, and at least sections of each of the pairs of opposite edges of the sheet are folded such as to define attachment elements.

In one embodiment at least ones of the edges of the sheet have an attachment element extending along substantially the length thereof.

In another embodiment at least ones of the edges of the sheet have an attachment element extending along part of the length thereof.

Preferably, the part comprises a mid part.

In a further embodiment at least ones of the edges of the sheet have attachment elements extending along parts of the length thereof.

Preferably, the parts comprise end parts.

In one embodiment the sheet includes a pattern of printing apertures which define a pattern of deposits to be printed thereby.

In another embodiment the sheet is a blank and includes no printing apertures therein.

In one embodiment the sheet comprises a metal sheet.

In another embodiment the sheet comprises a plastics sheet.

In another aspect the present invention provides a printing screen, comprising a sheet, at least sections of at least one pair of opposite edges of which comprise a plurality of projections spaced along a length thereof.

Preferably, the projections comprise rectangular projections.

Preferably, the projections define a castellated structure.

In one embodiment the sheet includes a pattern of printing apertures which define a pattern of deposits to be printed thereby.

In another embodiment the sheet is a blank and includes no printing apertures therein.

In one embodiment the sheet comprises a metal sheet.

In another embodiment the sheet comprises a plastics sheet.

In a further aspect the present invention provides a printing screen unit, comprising: a printing screen, comprising a sheet at least sections of at least one pair of opposite edges of which include attachment elements; and at least one pair of interface members attachable to the attachment elements at the at least one pair of opposite edges of the sheet.

Preferably, the at least sections of the at least one pair of opposite edges of the sheet are folded such as to define attachment elements.

More preferably, the attachment elements are each folded inwardly such as to enclose an acute angle with a major surface of the sheet.

In one embodiment at least ones of the attachment elements each comprise a plurality of projections spaced along a length thereof.

Preferably, the projections comprise rectangular projections.

Preferably, the projections of each attachment element define a castellated structure.

In another embodiment at least ones of the attachment elements each comprise a single, continuous attachment element, and the sheet includes a plurality of flexing apertures in spaced relation along each of the opposite edges thereof in zones overlapping fold lines of the respective folds.

In one embodiment at least ones of the edges of the sheet have an attachment element extending along substantially the length thereof.

In another embodiment at least ones of the edges of the sheet have an attachment element extending along part of the length thereof.

Preferably, the part comprises a mid part.

In a further embodiment at least ones of the edges of the sheet have attachment elements extending along parts of the length thereof.

Preferably, the parts comprise end parts.

In one embodiment the printing screen unit comprises: a pair of interface members attachable to the attachment elements at one pair of opposite edges of the sheet.

In another embodiment the sheet has two pairs of opposite edges; and the printing screen unit comprises: a pair of interface members attachable to the attachment elements at one pair of opposite edges of the sheet; and further comprises: a pair of support members attachable to the other pair of opposite edges of the sheet.

In a further embodiment the sheet has two pairs of opposite edges, at least sections of which include attachment elements; and the printing screen unit comprises: first and second pairs of interface members attachable to the attachment elements at each of the pairs of opposite edges of the sheet.

Preferably, the printing screen unit further comprises: corner pieces coupling adjacent ends of each of the interface members such as to define a frame.

More preferably, the corner pieces each comprise one of first and second recesses or projections and the ends of the interface members each include the other of recesses or projections, which projections and recesses are engaged such as to provide for coupling of the interface members.

Yet more preferably, the recesses and projections of the corner pieces and the interface members are configured such as to provide for relative movement of the interface members on being tensioned by a tensioning mechanism.

More preferably, at least one of the corner pieces comprises at least first and second coupling members which are configured such as to enable assembly thereof with the projections and recesses of the at least one corner piece and interface members in engagement, thereby enabling assembly of the frame with the interface members thereof attached to the respective edges of the sheet.

In one embodiment the sheet includes a pattern of printing apertures which define a pattern of deposits to be printed thereby.

In another embodiment the sheet is a blank and includes no printing apertures therein.

In one embodiment the sheet comprises a metal sheet.

In another embodiment the sheet comprises a plastics sheet.

In one embodiment the interface members each include an attachment section which provides for attachment to the at least one attachment element at a respective edge of the sheet, and an engagement section for engagement to a tensioning mechanism.

Preferably, the attachment section of each interface member includes an attachment surface which in use is attached to the at least one attachment element at a respective edge of the sheet.

More preferably, the attachment surface of each interface member is inclined inwardly from a free edge of the attachment surface relative to the respective edge of the sheet.

More preferably, the attachment surface of each interface member is defined by a continuous surface.

Preferably, the engagement section of each interface member includes an engagement surface for engagement to a tensioning mechanism.

More preferably, the engagement surface of each interface member is inclined outwardly from a free edge of the engagement surface relative to the respective edge of the sheet.

More preferably, the engagement surface of each interface member is defined by a continuous surface.

In yet another aspect the present invention provides a frame for supporting a printing screen comprising a sheet having two pairs of opposite edges, at least sections of which include attachment elements, the frame comprising: first and second pairs of interface members attachable to the attachment elements at each of the pairs of opposite edges of the sheet; and corner pieces coupling adjacent ends of each of the interface members such as to define the frame.

Preferably, the corner pieces each comprise one of first and second recesses or projections and the ends of the interface members each include the other of recesses or projections, which projections and recesses are engaged such as to provide for coupling of the interface members.

More preferably, the recesses and projections of the corner pieces and the interface members are configured such as to provide for relative movement of the interface members on being tensioned by a tensioning mechanism.

Preferably, at least one of the corner pieces comprises at least first and second coupling members which are configured such as to enable assembly thereof with the projections and recesses of the at least one corner piece and interface members in engagement, thereby enabling assembly of the frame with the interface members thereof attached to the respective edges of the sheet.

In one embodiment the interface members each include an attachment section which provides for attachment to the at least one attachment element at a respective edge of the sheet, and an engagement section for engagement to a tensioning mechanism.

Preferably, the attachment section of each interface member includes an attachment surface which in use is attached to the at least one attachment element at a respective edge of the sheet.

More preferably, the attachment surface of each interface member is inclined inwardly from a free edge of the attachment surface relative to the respective edge of the sheet.

More preferably, the attachment surface of each interface member is defined by a continuous surface.

Preferably, the engagement section of each interface member includes an engagement surface for engagement to a tensioning mechanism.

More preferably, the engagement surface of each interface member is inclined outwardly from a free edge of the engagement surface relative to the respective edge of the sheet.

More preferably, the engagement surface of each interface member is defined by a continuous surface.

In a yet further aspect the present invention provides a printing screen unit, comprising: a printing screen, comprising a sheet; and at least one pair of interface members attached to at least one pair of opposite edges of the sheet.

In one embodiment the interface members are bonded to the printing screen.

Preferably, each interface member includes an engagement surface for engagement to a tensioning mechanism.

More preferably, the engagement surface of each interface member is inclined outwardly from a free edge of the engagement surface relative to the respective edge of the sheet.

More preferably, the engagement surface of each interface member is defined by a continuous surface.

In one embodiment the engagement surface is disposed outwardly of the respective edge of the sheet.

In another embodiment the engagement surface is disposed inwardly of the respective edge of the sheet.

In one embodiment the interface members each comprise a plurality of interface elements spaced along a length of the respective edge of the sheet.

In another embodiment the interface members each comprise first and second strips attached to opposite sides of the respective edge of the sheet.

In a further embodiment the interface members each comprise first and second strips attached to opposite sides of the respective edge of the sheet, and include a plurality of engagement apertures for engagement to a tensioning mechanism spaced along a length thereof.

Preferably, the sheet has two pairs of opposite edges, at least sections of which include attachment elements; and the printing screen unit comprises: first and second pairs of interface members attached to the at least one attachment element at each of the pairs of opposite edges of the sheet.

The present invention provides an improved printing screen unit which is compatible with existing support frame systems, with the interface members protecting edges of the printing screen from damage during handling and mounting, thereby increasing the life of the printing screen. Further, sharp edges of the printing screen are enclosed, making the printing screen safer to handle. In addition, the interface members confer structural support, reducing the flex in the printing screen during storage.

Significantly, the provision of interface members allows plastic sheet to be used as the primary material of printing screens for mounting on tensionable support frames.

Still further, the attachment of a printing screen to interface members further simplifies the manufacture of the printing screen unit as a whole, in obviating the need for an adhesive bond.

Preferred embodiments of the present invention will now be described hereinbelow by way of example only with reference to the accompanying drawings, in which.

Figure 1A:
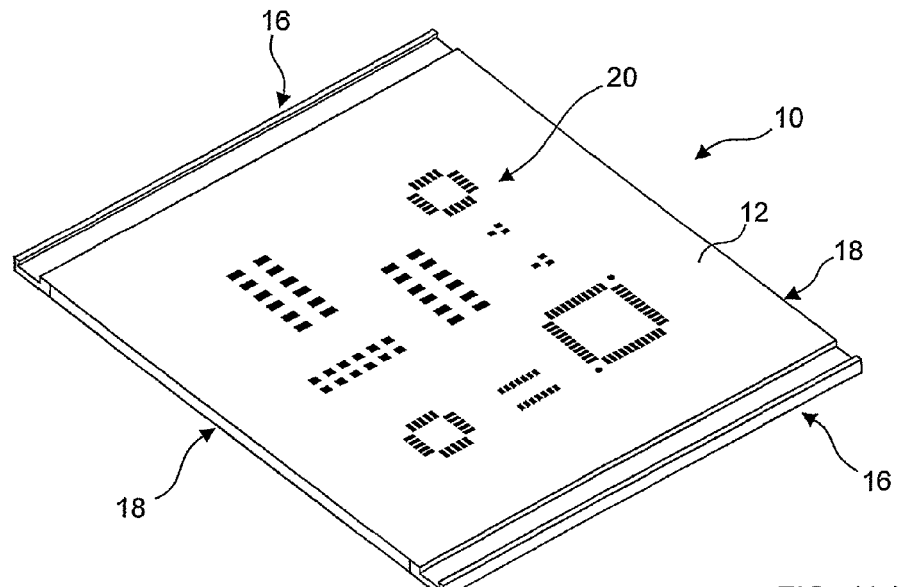
FIG. 1(a) illustrates a perspective view of a printing screen unit in accordance with a first embodiment of the present invention.
Figure 1B:
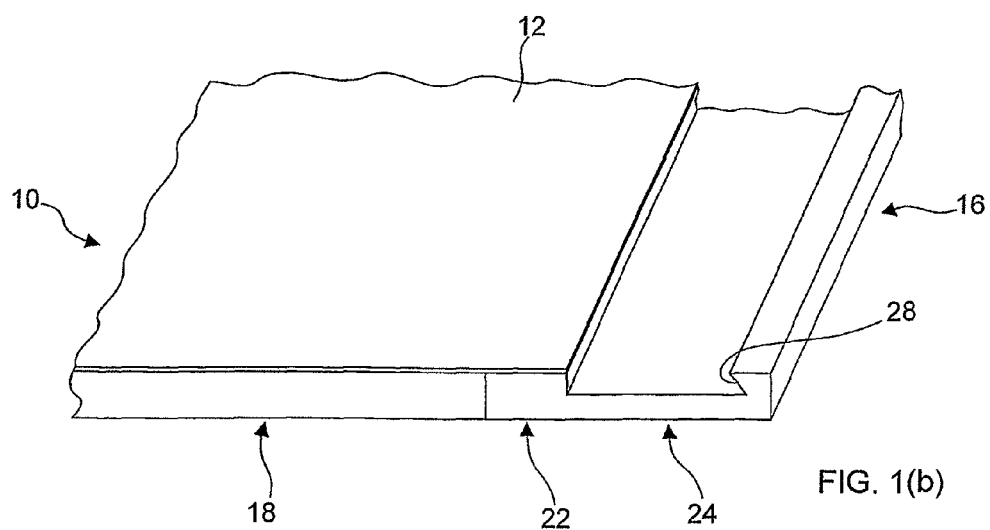
FIG. 1(b) illustrates one corner region of the printing screen unit of FIG. 1(a)
Figure 1C:
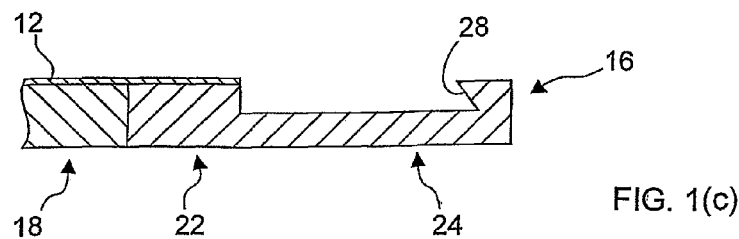
FIG. 1(c) illustrates a vertical sectional view through an edge region of the printing screen unit of FIG. 1(a)

FIGS. 1(a) to (c) illustrate a printing screen unit 10 in accordance with a first embodiment of the present invention.

The printing screen unit 10 comprises a printing screen 12, in this embodiment of rectangular shape, a pair of interface members 16, 16 which are attached to one pair of opposite edges of the printing screen 12, and a pair of support members 18, 18 which are attached to the other pair of opposite edges of the printing screen 12.

The printing screen 12 includes a pattern of apertures 20 which define the pattern of deposits to be printed. The pattern of apertures 20 can be formed, for example, by laser cutting or etching, as is well known in the art. In preferred embodiments the printing screen 12 comprises a sheet of a metal, such as stainless steel, or a plastic.

The interface members 16, 16 each comprise an elongate member which extends along the length of the respective edge of the printing screen 12.

The interface members 16, 16 each include an attachment section 22 which extends inwardly of the respective free edge of the printing screen 12, as illustrated in FIG. 1(c), and is in this embodiment bonded to the printing screen 12. The bonding of the interface members 16, 16 to the printing screen 12 may be by any suitable adhesive or curing technique, as would be known to a person skilled in the art.

The interface members 16, 16 each further include an engagement section 24 which, relative to the printing screen 12, is disposed outwardly of the attachment section 22 and provides for engagement to a tensioning mechanism.

The engagement section 24 includes an inwardly-facing engagement surface 28, in this embodiment defined by a continuous channel, which extends along the length of the respective interface member 16. The engagement surface 28 is outwardly inclined from the free edge thereof relative to the printing screen 12, such as to define a hook arrangement which provides for captive engagement with a tensioning mechanism. As will be appreciated, the engagement surface 28, in being defined by a continuous channel, allows for fabrication by a wide variety of manufacturing techniques, such as machining, routing and extrusion, which are much simpler and cheaper techniques than the fabrication techniques required in fabricating the printing screens of the prior art printing screen units.

The support members 18, 18 each comprise an elongate strip which extends along the length of the respective edge of the printing screen 12. The support members 18, 18 provide both that no free, sharp edges of the printing screen 12 are exposed, thereby preventing the risk of injury during handling, and also further support the printing screen 12, rendering the printing screen 12 less prone to flexing when being handled and stored. Furthermore, in providing the printing screen 12 with additional structural support, the printing screen 12 advantageously allows more readily for use of a plastic sheet. The use of plastic sheets has many advantages, in being cheaper, easier to fabricate, and lighter. As described hereinabove, metal sheets, such as stainless steel sheets, necessarily have to be used for existing printing screens which are mounted directly to tensionable support frames, as the design of those existing printing screens is not such as to withstand the tension applied thereto by tensionable support frames.

In one alternative embodiment the support members 18, 18 can be omitted from the printing screen unit 10.

In another alternative embodiment the printing screen unit 10 could include a second pair of interface members 16, 16 attached to respective ones of the other pair of opposite edges of the printing screen 12.

Figure 2A:
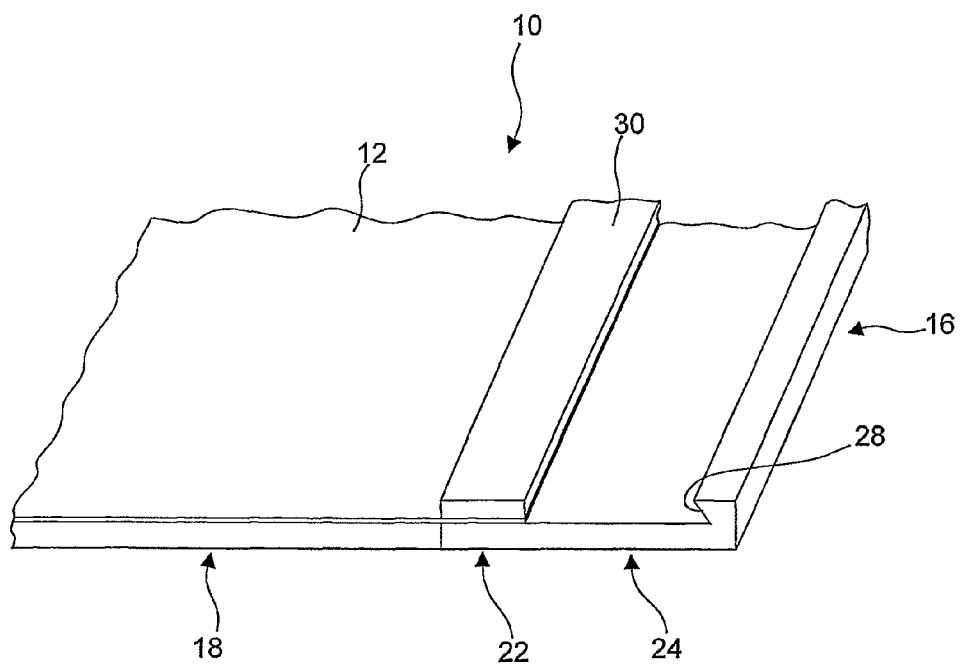
FIG. 2(a) illustrates one corner region of a printing screen unit in accordance with a second embodiment of the present invention.
Figure 2B:
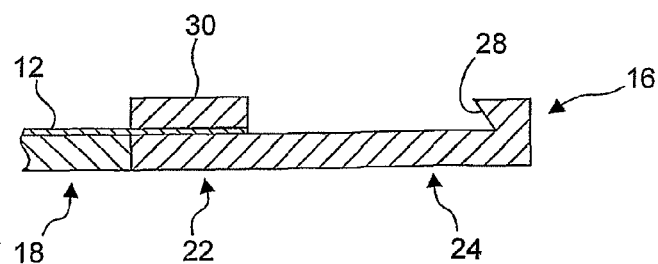
FIG. 2(b) illustrates a vertical sectional view through an edge region of the printing screen unit of FIG. 2(a)

FIGS. 2(a) and (b) illustrate a printing screen unit 10 in accordance with a second embodiment of the present invention.

The printing screen unit 10 of this embodiment is very similar to the printing screen unit 10 of the above-described first embodiment, and thus, in order to avoid unnecessary duplication of description, only the differences will be described in detail, with like parts being designated by like reference signs.

The printing screen unit 10 of this embodiment differs from that of the first-described embodiment only in the manner of attachment of the printing screen 12 to the interface members 16, 16.

In this embodiment the interface members 16, 16 each include an elongate cover strip 30 which is bonded over the respective free edge of the printing screen 12 such as to enclose the same. The bonding of the printing screen 12 to the main bodies and the cover strips 30 of the interface members 16, 16 can be by any suitable adhesive or curing technique, as would be known to a person skilled in the art.

Figure 3A:
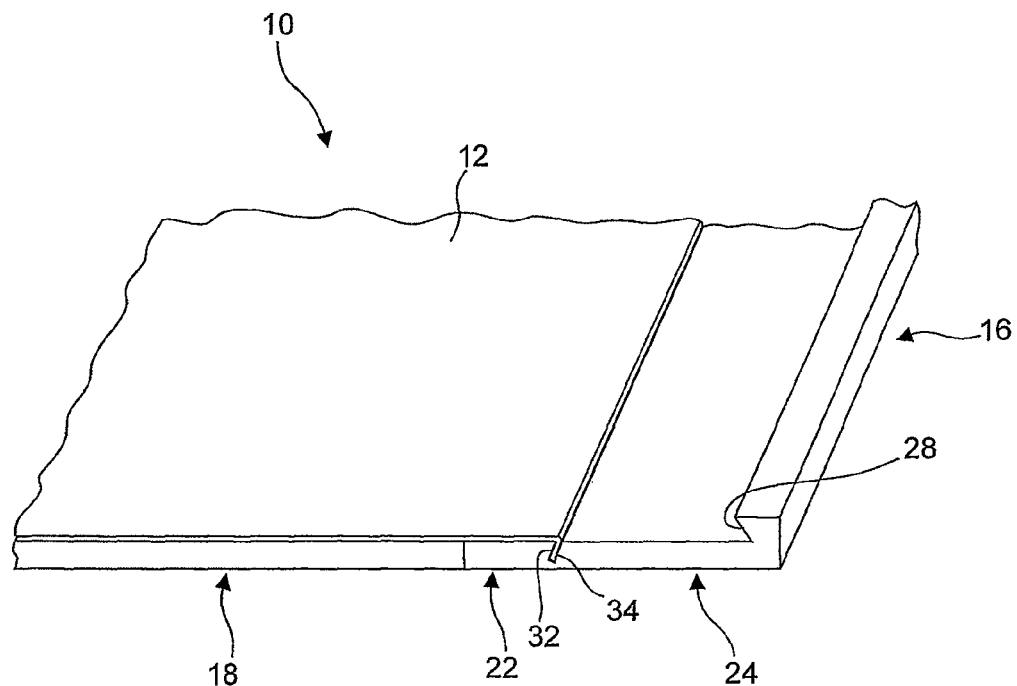
FIG. 3(a) illustrates one corner region of a printing screen unit in accordance with a third embodiment of the present invention.
Figure 3B:
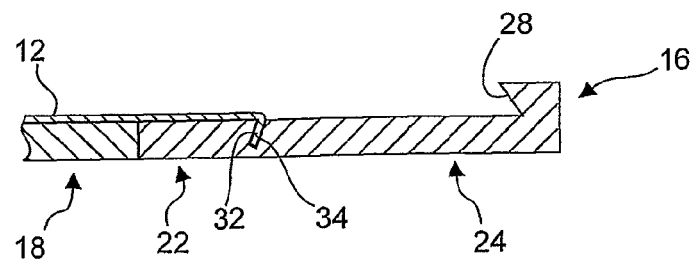
FIG. 3(b) illustrates a vertical sectional view through an edge region of the printing screen unit of FIG. 3(a)

FIGS. 3(a) and (b) illustrate a printing screen unit 10 in accordance with a third embodiment of the present invention.

The printing screen unit 10 of this embodiment is quite similar to the printing screen unit 10 of the above-described first embodiment, and thus, in order to avoid unnecessary duplication of description, only the differences will be described in detail, with like parts being designated by like reference signs.

The printing screen unit 10 of this embodiment differs from that of the first-described embodiment only in the manner of attachment of the printing screen 12 to the interface members 16, 16.

In this embodiment the edges of the printing screen 12 to which the interface members 16, 16 are attached are folded to define attachment elements 32, 32, and the attachment section 22 of each interface member 16 includes a narrow, attachment slot 34 which extends along the length thereof and in which a respective one of the attachment elements 32, 32 is a frictional fit. In this embodiment the edges of the printing screen 12 are folded such that the attachment elements 32, 32 defined thereby enclose an acute angle with the main body of the printing screen 12, and the attachment slots 34 in the interface members 16, 16 are inclined inwardly towards the respective inner edges thereof. In this embodiment the interface members 16, 16 are slid onto the respective attachment elements 32, 32 of the printing screen 12 and held thereto by the frictional engagement therebetween, with there being no bonding thereof. In one embodiment the interface members 16, 16 could be bonded to the attachment elements 32, 32 of the printing screen 12. With this configuration, the attachment elements 32, 32 become more firmly engaged in the attachment slots 34 in the respective interface members 16, 16 on tensioning the printing screen unit 10.

Figure 4A:
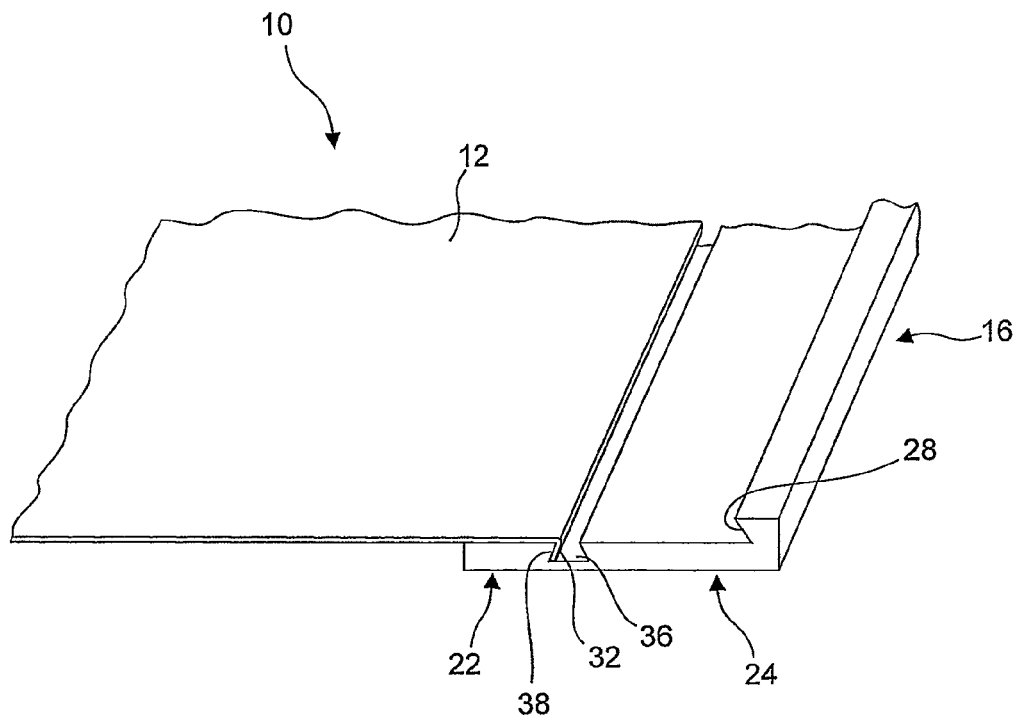
FIG. 4(a) illustrates one corner region of a printing screen unit in accordance with a fourth embodiment of the present invention.
Figure 4B:
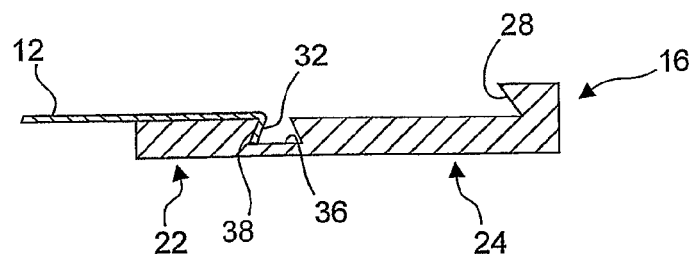
FIG. 4(b) illustrates a vertical sectional view through an edge region of the printing screen unit of FIG. 4(a)

FIGS. 4(*a*) and (*b*) illustrate a printing screen unit 10 in accordance with a fourth embodiment of the present invention.

The printing screen unit 10 of this embodiment is quite similar to the printing screen unit 10 of the above-described first embodiment, and thus, in order to avoid unnecessary duplication of description, only the differences will be described in detail, with like parts being designated by like reference signs.

The printing screen unit 10 of this embodiment differs from that of the first-described embodiment in the manner of attachment of the printing screen 12 to the interface members 16, 16 and by the omission of the support members 18, 18.

In this embodiment the edges of the printing screen 12 to which the interface members 16, 16 are attached are folded to define attachment elements 32, 32, and the attachment section 22 of each interface member 16 includes an attachment groove 36 which extends along the length thereof, in this embodiment defined by a continuous channel, in which a respective one of the attachment elements 32, 32 is located. In this embodiment the edges of the printing screen 12 are folded such that the attachment elements 32, 32 defined thereby enclose an acute angle with the main body of the printing screen 12. In this embodiment the attachment groove 36 in the attachment section 22 of each interface member 16 defines an attachment surface 38 at the inner edge thereof relative to the printing screen 12. The attachment surface 38 is inwardly inclined from the free edge thereof relative to the printing screen 12, such as to define a hook arrangement which provides for attachment with a respective one of the attachment elements 32 of the printing screen 12. In being inwardly inclined, the attachment surface 38 of each attachment groove 36 provides for the captive attachment of the respective attachment element 32 of the printing screen 12 on tensioning the printing screen unit 10.

Figure 5A:
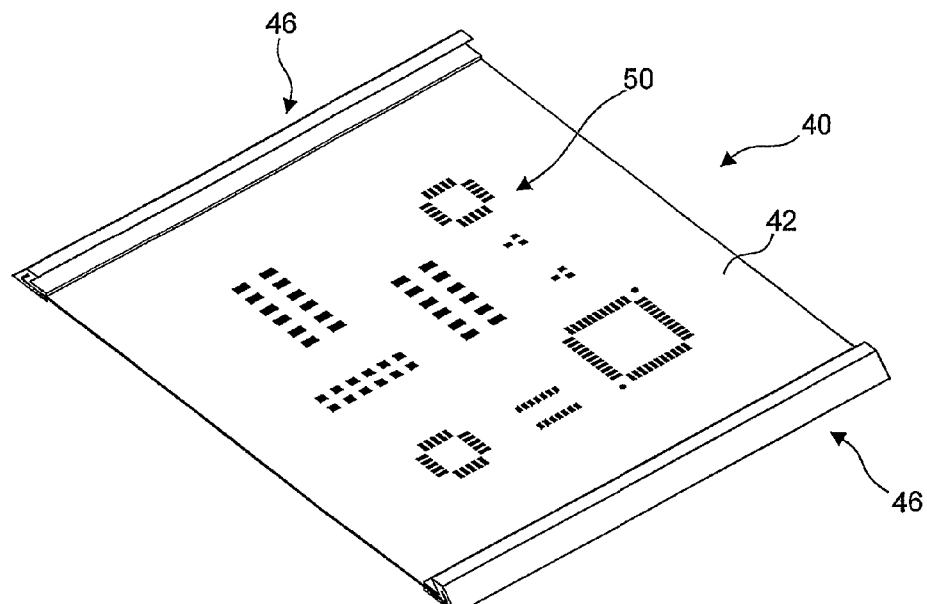
FIG. 5(a) illustrates a perspective view of a printing screen unit in accordance with a fifth embodiment of the present invention.
Figure 5B:
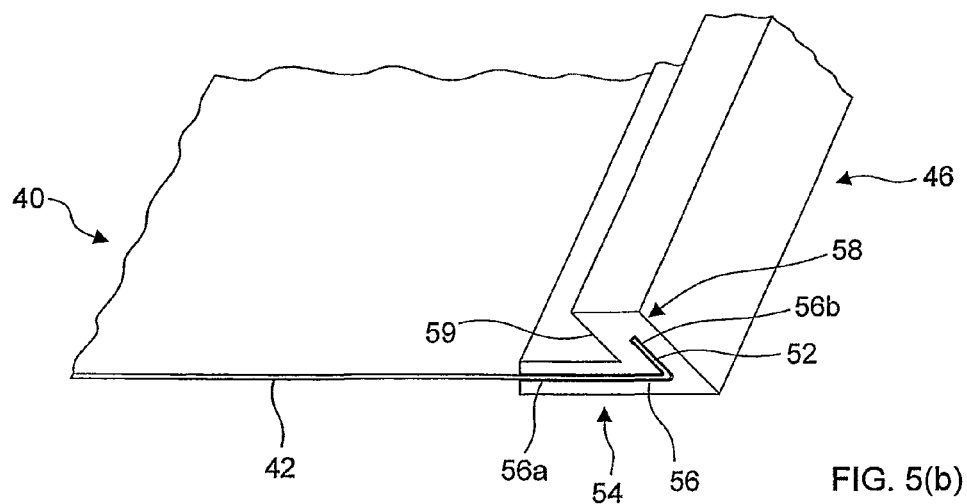
FIG. 5(b) illustrates one corner region of the printing screen unit of FIG. 5(a)
Figure 5C:
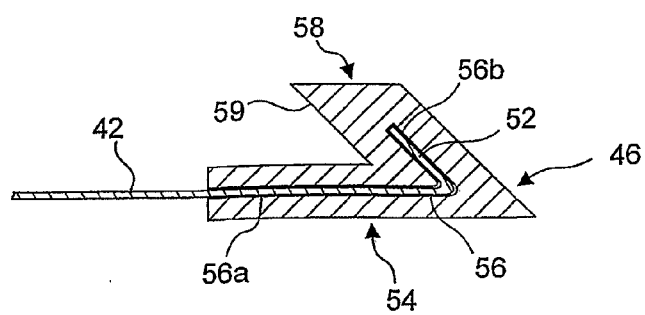
FIG. 5(c) illustrates a vertical sectional view through an edge region of the printing screen unit of FIG. 5(a)

FIGS. 5(*a*) to (*c*) illustrate a printing screen unit 40 in accordance with a fifth embodiment of the present invention.

The printing screen unit 40 comprises a printing screen 42, in this embodiment of rectangular shape, and a pair of interface members 46, 46 which are attached to one pair of opposite edges of the printing screen 42.

The printing screen 42 includes a pattern of apertures 50 which define the pattern of deposits to be printed. The pattern of apertures 50 can be formed, for example, by laser cutting or etching, as is well known in the art. In preferred embodiments the printing screen 42 comprises a sheet of a metal, such as stainless steel, or a plastic.

The edges of the printing screen 42 to which the interface members 46, 46 are attached are folded to define attachment elements 52, 52. In this embodiment the edges of the printing screen 42 are folded such that the attachment elements 52, 52 defined thereby enclose an acute angle with the main body of the printing screen 42.

The interface members 46, 46 each comprise an elongate member which extends along the length of the respective edge of the printing screen 42.

The interface members 46, 46 each include an attachment section 54 which includes an attachment slot 56 which extends along the length thereof and in which a respective one of the attachment elements 52, 52 of the printing screen 42 is located.

The attachment slot 56 comprises a first, support slot part 56*a*, in this embodiment of linear section, which extends inwardly into the attachment section 54 from the inner edge of the respective interface member 46, and receives the region of the printing screen 42 which is inwardly adjacent the respective attachment element 52 of the printing screen 42 and acts to support the respective interface member 46 in the required orient relative to the printing screen 42.

The attachment slot 56 further comprises a second, attachment slot part 56*b* which extends inwardly and backwardly from the distal end of the support slot part 56*a* such as to define a hook arrangement which provides for attachment with the respective attachment element 52 of the printing screen 42. In being inwardly inclined, the attachment slot part 56*b* of the attachment slot 56 provides for the captive attachment of the respective attachment element 52 of the printing screen 42.

The interface members 46, 46 each further include an engagement section 58 which provides for engagement to a tensioning mechanism.

The engagement section 58 includes an inwardly-facing engagement surface 59, in this embodiment defined by a continuous rebate, which extends along the length of the respective interface member 46. The engagement surface 59 is outwardly inclined from the free edge thereof relative to the printing screen 42, such as to define a hook arrangement which provides for captive engagement with a tensioning mechanism. As will be appreciated, the engagement section 58, in being defined by a continuous rebate, allows for fabrication by a large variety of manufacturing techniques, such as machining, routing and extrusion, which are much simpler and cheaper techniques than the fabrication techniques required in fabricating the printing screens of the prior art printing screen units.

In an alternative embodiment the printing screen unit 40 could include a second pair of interface members 46, 46 attached to respective ones of the other pair of opposite edges of the printing screen 42.

Figure 6A:
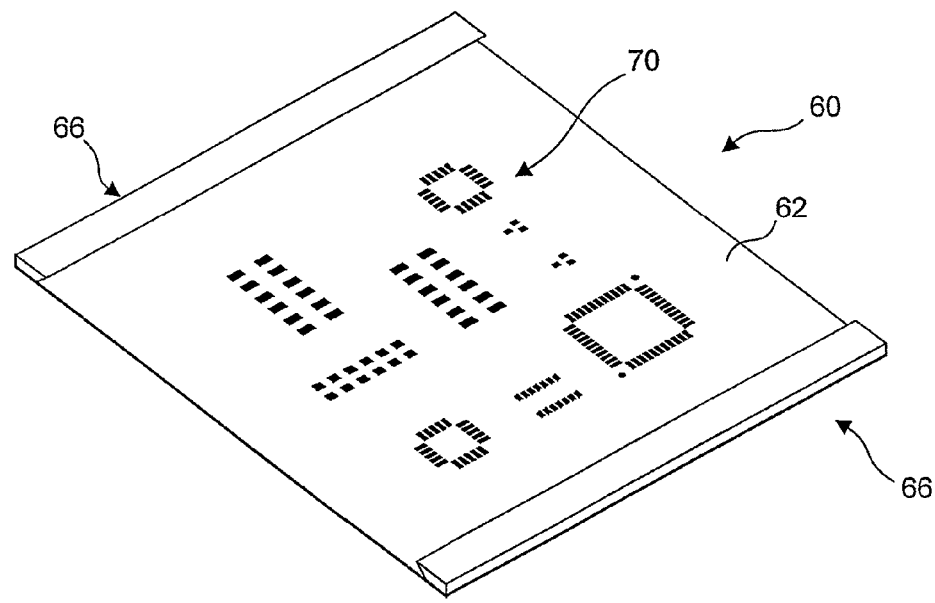
FIG. 6(a) illustrates a perspective view of a printing screen unit in accordance with a sixth embodiment of the present invention.
Figure 6B:
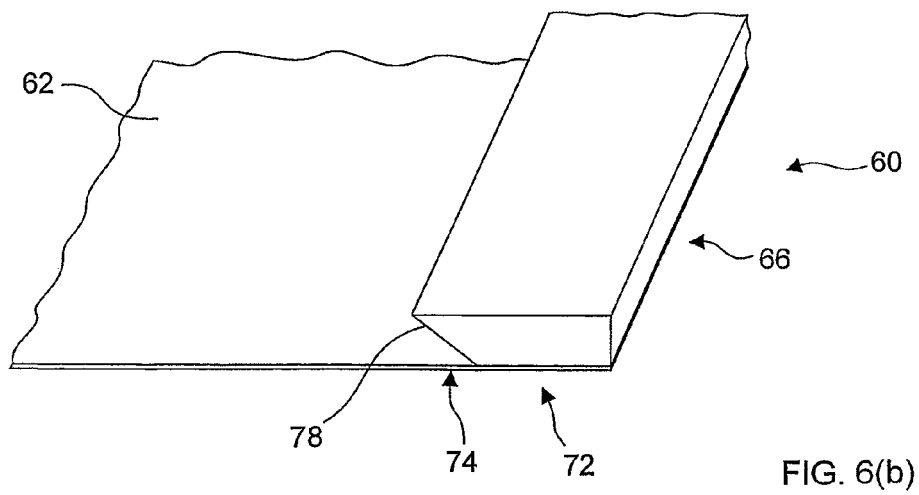
FIG. 6(b) illustrates one corner region of the printing screen unit of FIG. 6(a)
Figure 6C:
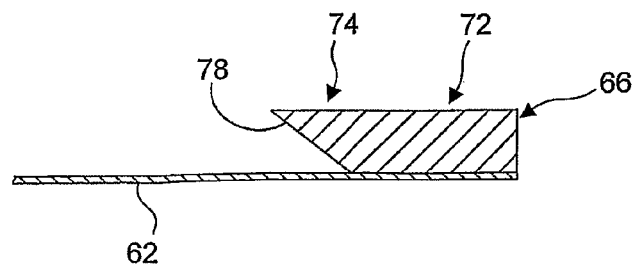
FIG. 6(c) illustrates a vertical sectional view through an edge region of the printing screen unit of FIG. 6(a)

FIGS. 6(*a*) to (*c*) illustrate a printing screen unit 60 in accordance with a sixth embodiment of the present invention.

The printing screen unit 60 comprises a printing screen 62, in this embodiment of rectangular shape, and a pair of interface members 66, 66 which are attached to one pair of opposite edges of the printing screen 62 and extend inwardly thereof.

The printing screen 62 includes a pattern of apertures 70 which define the pattern of deposits to be printed. The pattern of apertures 70 can be formed, for example, by laser cutting or etching, as is well known in the art. In preferred embodiments the printing screen 62 comprises a sheet of a metal, such as stainless steel, or a plastic.

The interface members 66, 66 each comprise an elongate member which extends along the length of the respective edge of the printing screen 12.

The interface members 66, 66 each include an attachment section 72 which is located at the respective free edge of the printing screen 62, as illustrated in FIG. 6(*c*), and is in this embodiment bonded to the printing screen 62. The bonding of the interface members 66, 66 to the printing screen 62 may be by any suitable adhesive or curing technique, as would be known to a person skilled in the art.

The interface members 66, 66 each further include an engagement section 74 which provides for engagement to a tensioning mechanism.

The engagement section 74 includes an inwardly-facing engagement surface 78, in this embodiment defined by a continuous surface, which extends along the length of the respective interface member 66. The engagement surface 78 is outwardly inclined from the free edge thereof relative to the printing screen 62, such as to define a hook arrangement which provides for captive engagement with a tensioning mechanism. As will be appreciated, the engagement surface 78, in being defined by a continuous surface, allows for fabrication by a wide variety of manufacturing techniques, such as machining, routing and extrusion, which are much simpler and cheaper techniques than the fabrication techniques required in fabricating the printing screens of the prior art printing screen units.

In one alternative embodiment the printing screen unit 60 could include a second pair of interface members 66, 66 attached to respective ones of the other pair of opposite edges of the printing screen 62.

In another alternative embodiment the interface members 66, 66 can be configured such as to extend beyond the respective edges of the printing screen 62 to which the interface members 66, 66 are attached. In one embodiment the interface members 66, 66 can each include, as in the second-described embodiment, an elongate cover strip which is bonded over the respective free edge of the printing screen 62 such as to enclose the same.

Figure 7A:
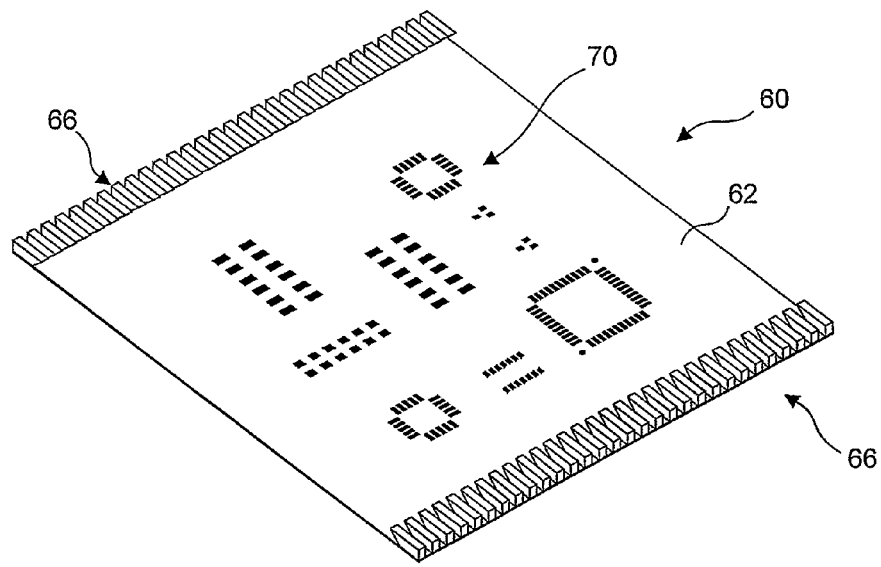
FIG. 7(a) illustrates a perspective view of a printing screen unit in accordance with a seventh embodiment of the present invention.
Figure 7B:
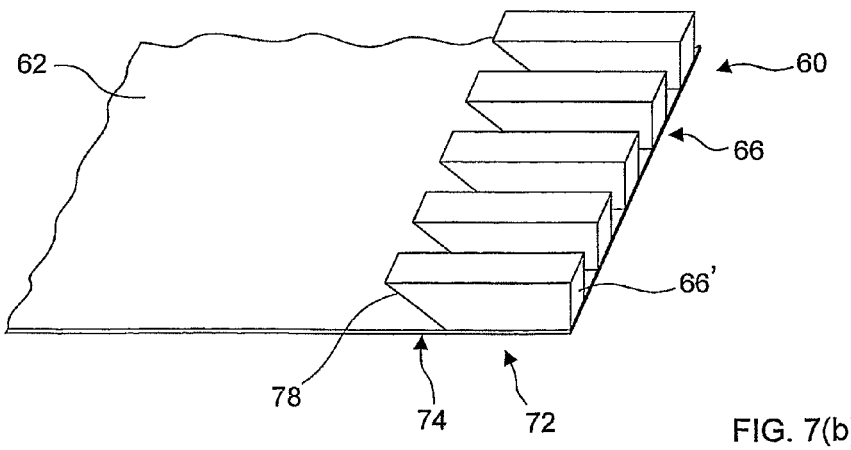
FIG. 7(b) illustrates one corner region of the printing screen unit of FIG. 7(a)
Figure 7C:
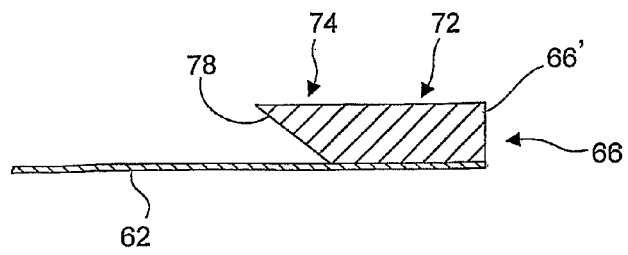
FIG. 7(c) illustrates a vertical sectional view through an edge region of the printing screen unit of FIG. 7(a)

FIGS. 7(*a*) and (*b*) illustrate a printing screen unit 60 in accordance with a seventh embodiment of the present invention.

The printing screen unit 60 of this embodiment is quite similar to the printing screen unit 60 of the above-described sixth embodiment, and thus, in order to avoid unnecessary duplication of description, only the differences will be described in detail, with like parts being designated by like reference signs.

The printing screen unit 60 of this embodiment differs from that of the sixth-described embodiment only in the construction of the interface members 66, 66.

In this embodiment the interface members 66, 66 each comprise a plurality of block elements 66' which are spaced along the lengths of the respective edges of the printing screen 62 to which the interface members 66, 66 are attached.

In one embodiment, where the printing screen 62 is formed of a plastics material, the block elements 66' of the interface members 66, 66 could be machined or formed into a uniform thick plastic sheet.

Figure 8A:
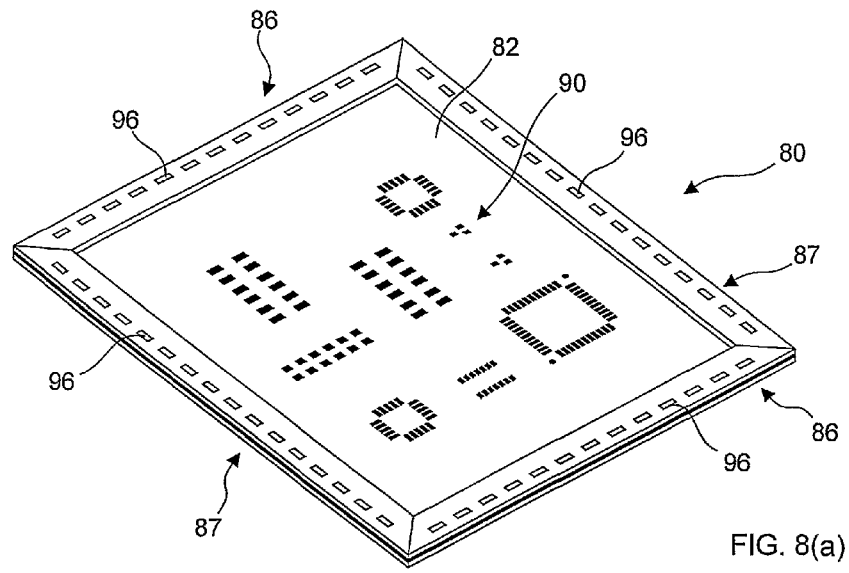
FIG. 8(a) illustrates a perspective view of a printing screen unit in accordance with an eighth embodiment of the present invention.
Figure 8B:
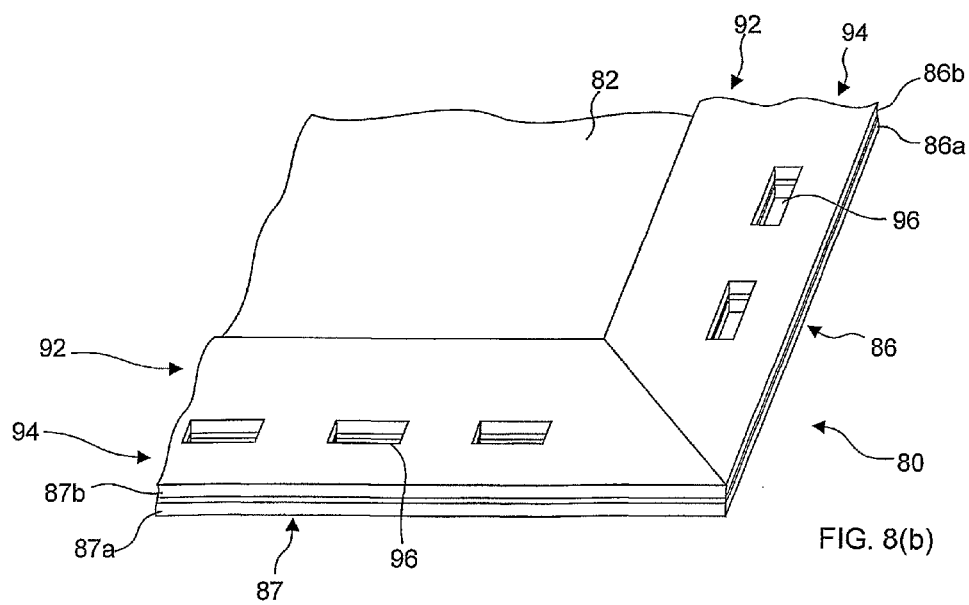
FIG. 8(b) illustrates one corner region of the printing screen unit of FIG. 8(a)
Figure 8C:
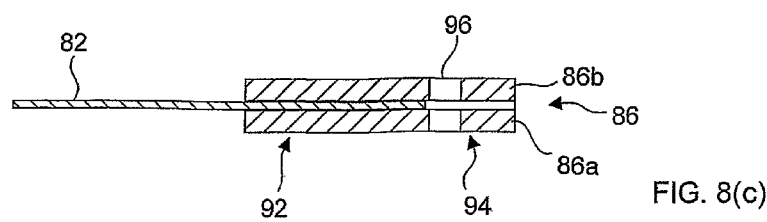
FIG. 8(c) illustrates a vertical sectional view through an edge region of the printing screen unit of FIG. 8(a)

FIGS. 8(*a*) to (*c*) illustrate a printing screen unit 80 in accordance with an eighth embodiment of the present invention.

The printing screen unit 80 comprises a printing screen 82, in this embodiment of rectangular shape, and first and second pairs of interface members 86, 86, 87, 87 which are attached to the respective pairs of opposite edges of the printing screen 82 and together define a supporting frame.

The printing screen 82 includes a pattern of apertures 90 which define the pattern of deposits to be printed. The pattern of apertures 90 can be formed, for example, by laser cutting or etching, as is well known in the art. In preferred, embodiments the printing screen 82 comprises a sheet of a metal, such as stainless steel, or a plastic.

The interface members 86, 86, 87, 87 each comprise a pair of elongate strips 86*a*, 86*b*, 87*a*, 87*b* which extend along the length of the respective edge of the printing screen 82, with the strips 86*a*, 86*b*, 87*a*, 87*b* being disposed on opposite sides of the printing screen 82 and overlapping the respective edge of the printing screen 82 so as to sandwich the same.

The interface members 86, 86, 87, 87 each include an attachment section 92 which extends inwardly of the respective free edge of the printing screen 82, as illustrated in FIG. 8(*c*), and is in this embodiment bonded to the printing screen 82. The bonding of the interface members 86, 86, 87, 87 to the printing screen 82 may be by any suitable adhesive or curing technique, as would be known to a person skilled in the art.

The interface members 86, 86, 87, 87 each further include an engagement section 94 which provides for engagement to a tensioning mechanism.

The engagement section 94 includes a plurality of engagement apertures 96 which are spaced along the length of the respective interface member 86, 86, 87, 87 and provide for engagement to a tensioning mechanism.

In this embodiment the printing screen unit 80 includes interface members 86, 86, 87, 87 which extend along each of the edges of the printing screen 82 and together define a frame which supports the printing screen 82, but in an alternative embodiment the printing screen unit 80 can include only a single pair of interface members 86, 86 which extend along one pair of opposite edges of the printing screen 82.

As mentioned hereinabove, in providing the printing screen 82 with structural support through the provision of interface members 86, 86, 87, 87, the printing screen 82 advantageously allows more readily for use of a plastic sheet. The use of plastic sheets has many advantages, in being cheaper, easier to fabricate, and lighter. As again mentioned hereinabove, metal sheets, such as stainless steel sheets, have to date necessarily been used for existing printing screens which are mounted directly to tensionable support frames, as the design of those existing printing screens is not such as to withstand the tension applied thereto by tensionable support frames.

Figure 9A:
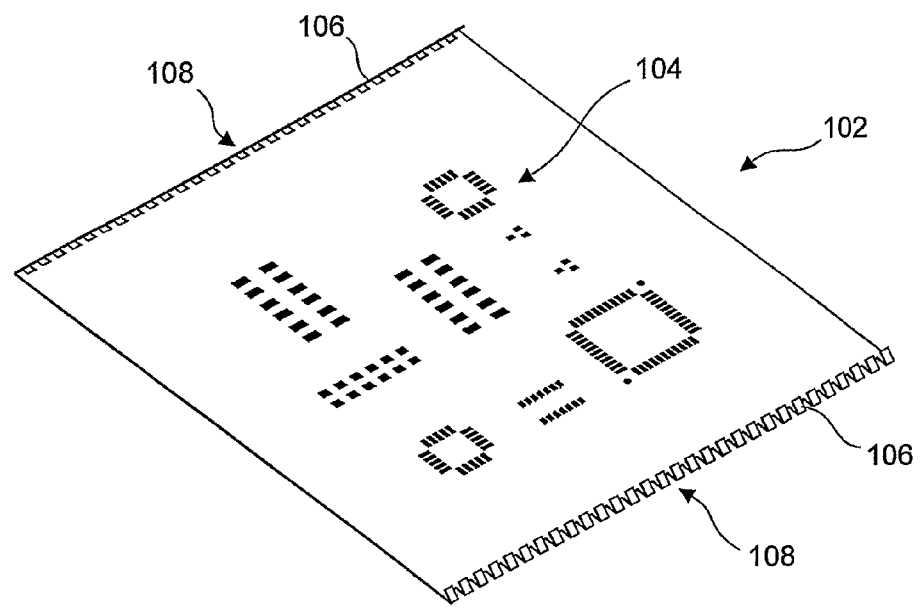
FIG. 9(a) illustrates a perspective view of a printing screen in accordance with a ninth embodiment of the present invention.
Figure 9B:
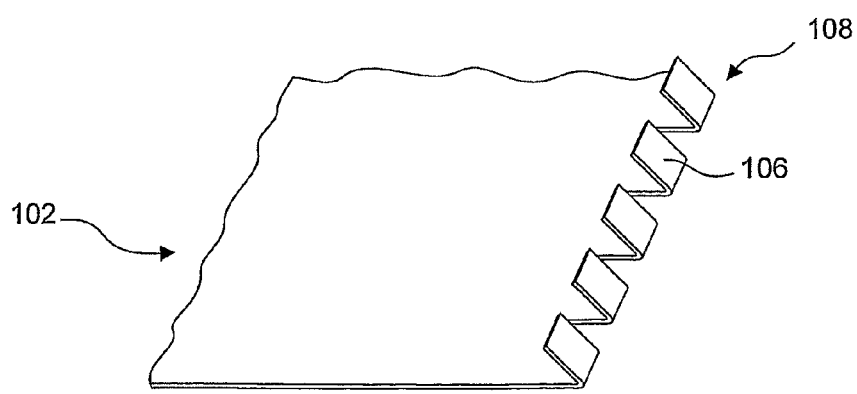
FIG. 9(b) illustrates one corner region of the printing screen of FIG. 9(a)
Figure 9C:
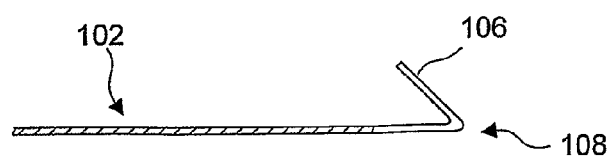
FIG. 9(c) illustrates a vertical sectional view through an edge region of the printing screen of FIG. 9(a)
Figure 10A:
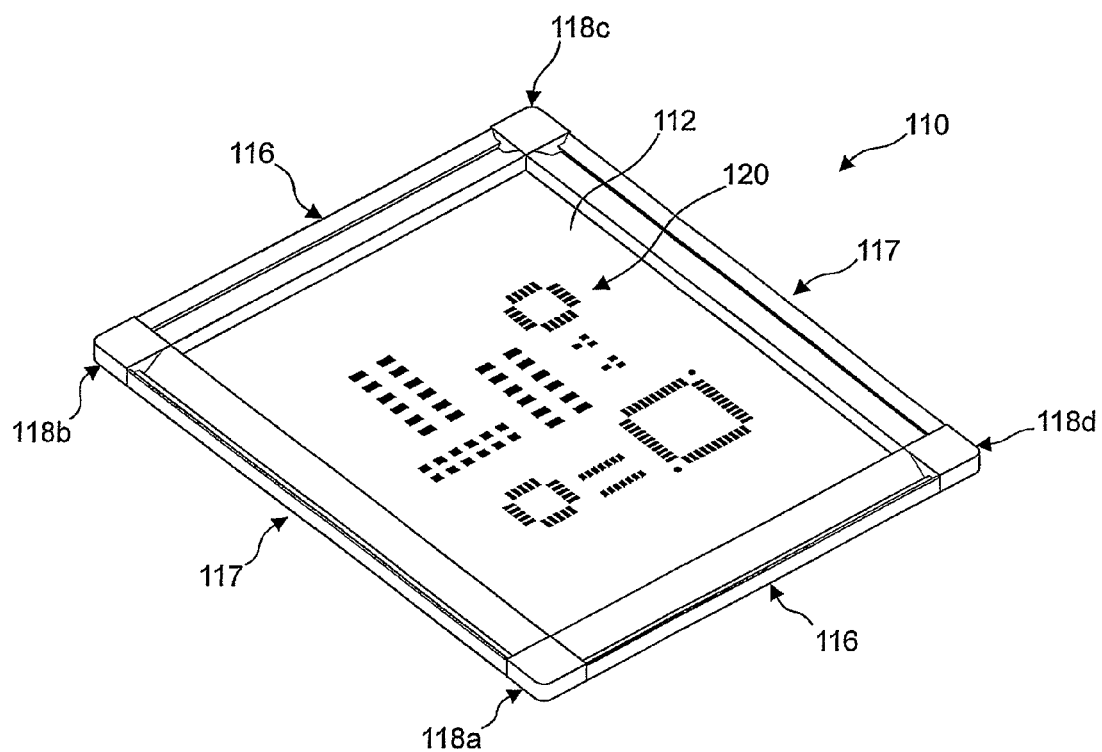
FIG. 10(a) illustrates a perspective view of a printing screen unit in accordance with a tenth embodiment of the present invention.
Figure 10B:
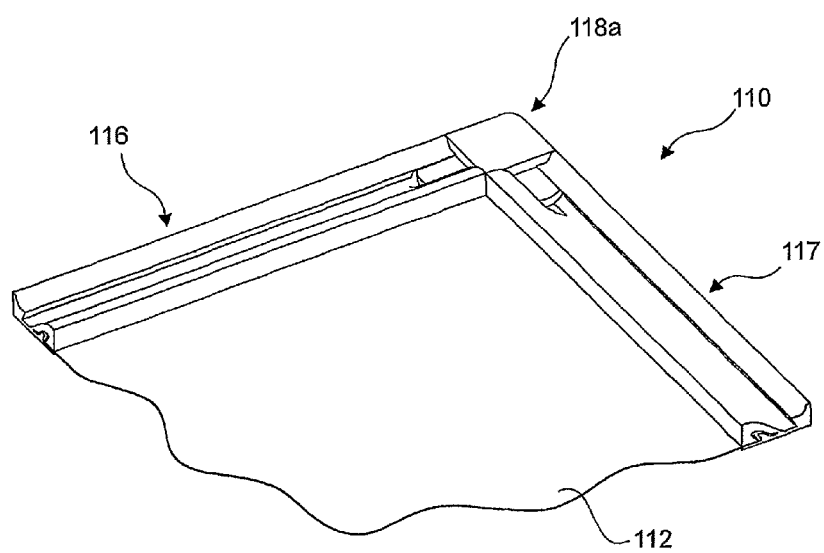
FIG. 10(b) illustrates the upper side of one corner region of the printing screen unit of FIG. 10(a)
Figure 10C:
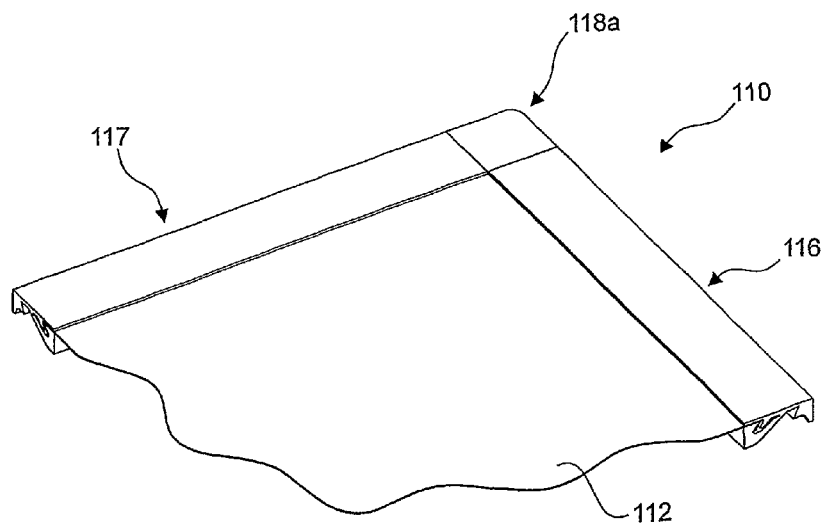
FIG. 10(c) illustrates the under side of the one corner region of the printing screen unit of FIG. 10(a)
Figure 10D:
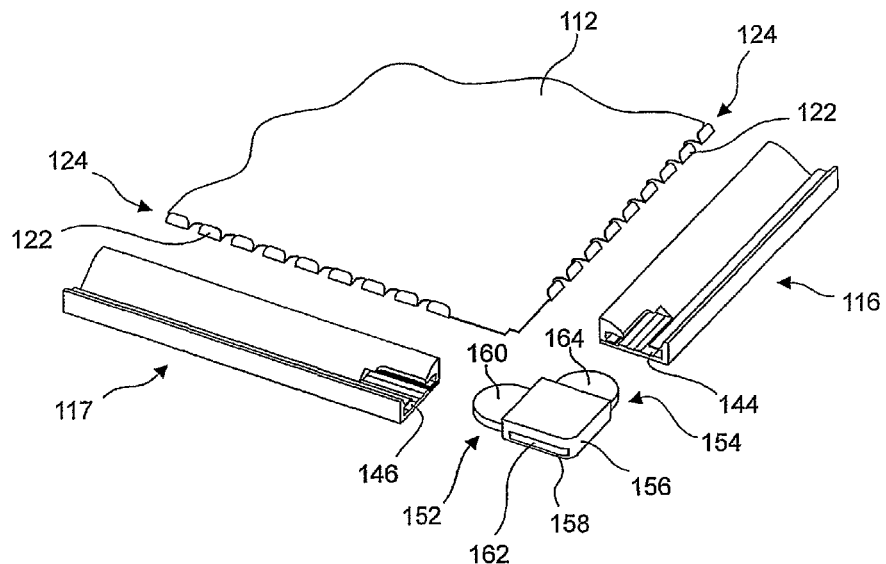
FIG. 10(d) illustrates an exploded perspective view of the one corner region of the printing screen unit of FIG. 10(a)
Figure 10F:
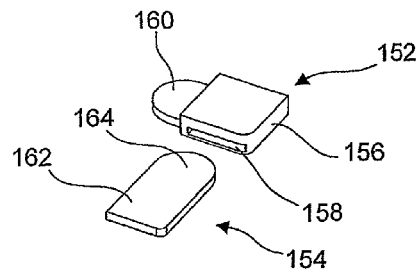
FIG. 10(f) illustrates an exploded perspective view of one corner piece of the printing screen unit of FIG. 10(a)
Figure 10E:
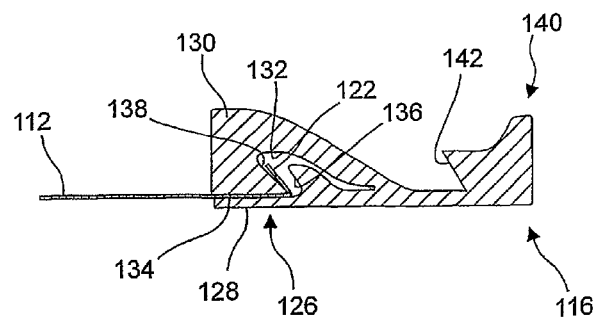
FIG. 10(e) illustrates a vertical sectional view through an edge region of the printing screen unit of FIG. 10(a)

FIGS. 9(*a*) to (*c*) illustrate a printing screen 102 in accordance with a ninth embodiment of the present invention.

The printing screen 102, in this embodiment of rectangular shape, includes a pattern of apertures 104 which define the pattern of deposits to be printed. The pattern of apertures 104 can be formed, for example, by laser cutting or etching, as is well known in the art. In a preferred embodiment the printing screen 102 comprises a sheet of a metal, such as stainless steel.

The edges of the printing screen 102 to which tensioning mechanisms are to be attached each comprise a plurality of spaced projections 106 along the length thereof which define a castellated structure, and are folded to define attachment elements 108, 108. In this embodiment the edges of the printing screen 102 are each folded along a line intersecting the projections 106, here at substantially a mid point of the length of the projections 106, with each of projections 106 defining a hook element. In this embodiment the edges of the printing screen 102 are folded such that the attachment elements 108, 108 defined thereby enclose an acute angle with the main body of the printing screen 102.

The projections 106 which define the castellated structures can, for example, be formed using a press tool or laser. Alternatively, the projections 106 could be formed by electro-discharge machining (EDM) or water jet milling, which fabrication techniques would allow several printing screens 102 to be fabricated simultaneously.

The edges of the printing screen 102 can be folded by using, for example, a roll or press tool.

In this embodiment, the configuration of the folded projections 106, which define the castellated structures, advantageously provides for the application of a uniform tension over the main body of the printing screen 102 in taking up the shape of the tensioning mechanisms, and thereby prevents distortion of the main body of the printing screen 102, which typically has to be maintained flat.

FIGS. 10(a) to (f) illustrate a printing screen unit 110 in accordance with a tenth embodiment of the present invention.

The printing screen unit 110 comprises a printing screen 112, in this embodiment of rectangular shape, and first and second pairs of interface members 116, 116, 117, 117 which are attached to the respective pairs of opposite edges of the printing screen 112 and coupled by corner pieces 118a-d such as to define a supporting frame.

The printing screen 112 includes a pattern of apertures 120 which define the pattern of deposits to be printed. The pattern of apertures 120 can be formed, for example, by laser cutting or etching, as is well known in the art. In preferred embodiments the printing screen 112 comprises a sheet of a metal, such as stainless steel, or a plastic.

The edges of the printing screen 112 to which tensioning mechanisms are to be attached each comprise a plurality of spaced projections 122 along the length thereof which define a castellated structure, and are folded to define attachment elements 124, 124. In this embodiment the edges of the printing screen 112 are each folded along a line intersecting the projections 122, here at substantially a mid point of the length of the projections 122, with each of projections 122 defining a hook element. In this embodiment the edges of the printing screen 112 are folded such that the attachment elements 124, 124 defined thereby enclose an acute angle with the main body of the printing screen 112.

The projections 122 which define the castellated structures can, for example, be formed using a press tool or laser. Alternatively, the projections 122 could be formed by electro-discharge machining (EDM) or water jet milling, which fabrication techniques would allow several printing screens 112 to be fabricated simultaneously.

The edges of the printing screen 112 can be folded by using, for example, a roll or press tool.

In this embodiment, the configuration of the folded projections 122, which define the castellated structures, advantageously provides for the application of a uniform tension over the main body of the printing screen 112 in taking up the shape of the tensioning mechanisms, and thereby prevents distortion of the main body of the printing screen 112, which typically has to be maintained flat.

The interface members 116, 116, 117, 117 each comprise an elongate member which extends along the length of the respective edge of the printing screen 112.

The interface members 116, 116, 117, 117 each include an attachment section 126 which comprises a first, lower body part 128 and a second, upper body part 130 and together define an attachment slot 132 which extends along the length thereof and in which a respective one of the attachment elements 124 of the printing screen 112 is located.

The attachment slot 132 comprises a first, support slot part 134, in this embodiment of linear section, which extends inwardly into the attachment section 126 from the inner edge of the respective interface member 116, 116, 117, 117, and receives the region of the printing screen 112 which is inwardly adjacent the respective attachment element 124 of the printing screen 112 and acts to support the respective interface member 116, 116, 117, 117 in the required orient relative to the printing screen 112.

The attachment slot 132 further comprises a second, attachment slot part 136 which includes an attachment surface 138 which extends inwardly and backwardly from the distal end of the support slot part 134 such as to define a hook arrangement which provides for attachment with the respective attachment element 124 of the printing screen 112. In being inwardly inclined, the attachment surface 138 provides for the captive attachment of the respective attachment element 124 of the printing screen 112.

The interface members 116, 116, 117, 117 each further include an engagement section 140 which, relative to the printing screen 112, is disposed outwardly of the attachment section 126 and provides for engagement to a tensioning mechanism.

The engagement section 140 includes an inwardly-facing engagement surface 142, in this embodiment defined by a continuous surface, which extends along the length of the respective interface member 116, 116, 117, 117. The engagement surface 142 is outwardly inclined from the free edge thereof relative to the printing screen 112, such as to define a hook arrangement which provides for captive engagement with a tensioning mechanism. As will be appreciated, the engagement section 140, in being defined by a continuous surface, allows for fabrication by a wide variety of manufacturing techniques, such as machining, routing and extrusion, which are much simpler and cheaper techniques than the fabrication techniques required in fabricating the printing screens of the prior art printing screen units.

The interface members 116, 116, 117, 117 each further include recesses 144, 146, in this embodiment of substantially rectangular section, at the distal ends thereof for receiving the tongue elements 160, 164 of respective corner pieces 118a-d, as will be described in more detail hereinbelow.

In this embodiment the corner pieces 118a-d each comprise first and second coupling members 152, 154, which lock together to define the respective corner pieces 118a-d.

In this embodiment the first coupling member 152 comprises a body element 156 which includes a slot 158, here of the same rectangular section as the recesses 144, 146 in the distal ends of the interface members 116, 116, 117, 117, which extends in a first direction therethrough, and a tongue element 160 for fitting in a respective one of the recesses 144, 146 in the distal ends of the interface members 116, 116, 117, 117 which extends from the body element 156 in a second direction orthogonal to the first direction of the slot 158 therein.

In this embodiment the second coupling member 154 comprises a body element 162, and a tongue element 164 for fitting in an adjacent one of the recesses 144, 146 in the distal ends of the interface members 116, 116, 117, 117 which extends from the body element 162. The body element 162 of the second coupling member 154 is configured to be a tight, snap-fit in the slot 158 in the body element 156 of the first coupling member 154 such that, when inserted therein, the tongue elements 160, 164 of the coupling members 152, 154 are locked in a coupling configuration. In one embodiment the coupling members 152, 154 could be bonded together.

With this configuration, the coupling members 152, 154 allow for the in situ assembly of the last of the corner pieces 118a-d to be fitted, in enabling the tongue elements 160, 164 of the respective pair of the coupling members 152, 154 to be inserted into respective recesses 144, 146 in the distal ends of the interface members 116, 116, 117, 117 in assembling the last corner piece 118a-d. It will be appreciated that three of the corner pieces 118a-d can be pre-assembled and need not be assembled in situ. Indeed, in one embodiment three of the corner pieces 118a-d can be fabricated as an integral unit, typically as a moulding or casting.

In this embodiment the tongue elements 160, 164 of the coupling members 152, 154 are configured such as to be a tight fit in the recesses 144, 146 in the distal ends of the interface members 116, 116, 117, 117, but such as to allow for movement of the tongue elements 160, 164 in the respective recesses 144, 146 in the direction of a tension as applied to the printing screen 112. With this configuration, the interface members 116, 116, 117, 117 present a substantially rigid frame when handled, but allow for relative movement of respective pairs of the interface members 116, 116, 117, 117 on being tensioned by tensioning mechanisms. In allowing for relative movement of the interface members 116, 116, 117, 117, design tolerances can be accommodated in order to provide for uniform tensioning of the printing screen 112.

Figure 11:
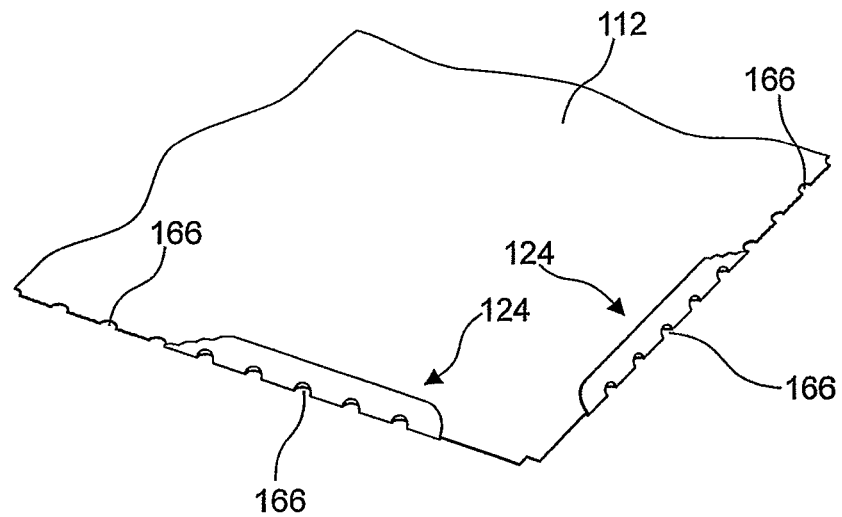
FIG. 11 illustrates one corner region of an alternative printing screen for the printing screen unit of FIG. 10(a), with the attachment elements being partially cut away for purposes of illustration.

In one alternative embodiment, as illustrated in FIG. 11, the printing screen 112 can include single, continuous attachment elements 124 along each of the edges thereof, with the printing screen 112 including a plurality of flexing apertures 166 in spaced relation along each of the fold lines of the folds. This configuration, similarly to the castellated structures, advantageously provides for the application of a uniform tension over the main body of the printing screen 112 and yet allows for flexing of the printing screen 112 in taking up the shape of the tensioning mechanisms.

Figure 12:
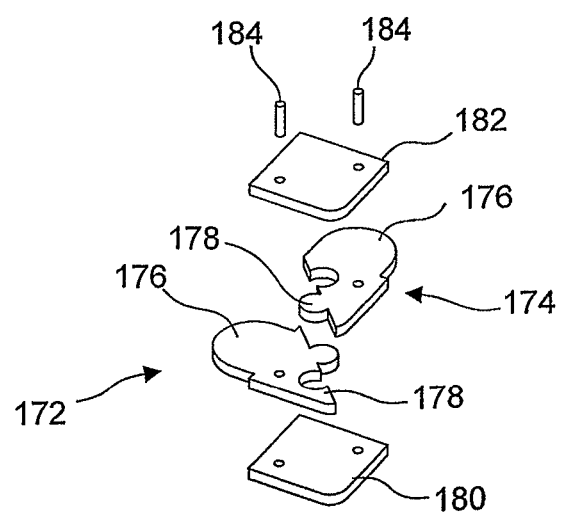
FIG. 12 illustrates an alternative corner piece for the printing screen unit of FIG. 10(a).

In another alternative embodiment, as illustrated in FIG. 12, the corner pieces 118a-d each comprise first and second coupling members 172, 174, which each comprise a tongue element 176 for fitting in a respective one of the recesses 144, 146 in the distal ends of the interface members 116, 116, 117, 117 and a keying structure 178 which provides for the locking of the coupling members 172, 174 in a coupling configuration, first and second capping members 180, 182 which are disposed to opposite sides of the coupling members 172, 174, and fixing pins 184 for fixing the capping members 180, 182 to the coupling members 172, 174 such as to fix the coupling members 172, 174 in the coupling configuration. In this embodiment the capping members 180, 182 are also bonded to the coupling members 172, 174.

In this embodiment the coupling members 172, 174 are fabricated from a sheet material and are of such a thickness as to allow for the in situ assembly of the last of the corner pieces 118a-d, in enabling the tongue elements 176 of a respective pair of the coupling members 172, 174 to be inserted into respective recesses 144, 146 in the distal ends of the interface members 116, 116, 117, 117 in overlapping relation and subsequent keying together of the keying structures 178 thereof in the manner of a jigsaw.

Finally, it will be understood that the present invention has been described in its preferred embodiments and can be modified in many different ways without departing from the scope of the invention as defined by the appended claims.

For example, in one modification, the folded edges of the printing screens 12, 42 of the third to fifth embodiments could utilize the castellated edge structures of the ninth-described embodiment.

Also, in the described embodiments which utilize interface members 16, 46, 66, 86, the interface members 16, 46, 66, 86 are described as extending along substantially the complete length of the respective edges of the printing screens 12, 42, 62, 82. In other embodiments the interface members 16, 46, 66, 86 can be attached only to part or parts of the respective edges of the printing screens 12, 42, 62, 82, for example, a mid part or end parts, with the interface members 16, 46, 66, 86 merely extending along the other parts or part such as to protect both the edges of the printing screens 12, 42, 62, 82 from damage and a user from the sharp edges of the printing screens 12, 42, 62, 82.

The invention claimed is:

1. A printing screen unit, comprising:
a printing screen, comprising a sheet having two pairs of opposite edges, at least sections of which include attachment elements; and a frame including first and second pairs of interface members attachable to the attachment elements at the respective pairs of opposite edges of the sheet and corner pieces coupling adjacent ends of each of the interface members, wherein the frame holds the printing screen captive in an untensioned state when no tension is applied thereto by external tensioning mechanisms separate to the frame, the frame having no element or device mounted thereto nor carried thereby for maintaining the printing screen in a tensioned state when no tension is applied thereto by external tensioning mechanisms separate to the frame, and the frame is substantially rigid when in the untensioned state, but allows for relative movement of the respective pairs of interface members by a tension applied by external tensioning mechanisms separate to the frame to tension the printing screen.

2. The printing screen unit of claim 1, wherein the sheet is a flat sheet.

3. The printing screen unit of claim 1, wherein the at least sections of each pair of opposite edges of the sheet are folded such as to define attachment elements.

4. The printing screen unit of claim 3, wherein the attachment elements are each folded inwardly such as to enclose an acute angle with a major surface of the sheet.

5. The printing screen unit of claim 3, wherein at least ones of the attachment elements each comprise a plurality of projections spaced along a length thereof.

6. The printing screen unit of claim 5, wherein the projections comprise rectangular projections.

7. The printing screen unit of claim 5, wherein the projections of each attachment element define a castellated structure.

8. The printing screen unit of claim 3, wherein at least ones of the attachment elements each comprise a single, continuous attachment element, and the sheet includes a plurality of flexing apertures in spaced relation along each of the opposite edges thereof in zones overlapping fold lines of the respective folds.

9. The printing screen unit of claim 1, wherein at least ones of the edges of the sheet have an attachment element extending along substantially the length thereof.

10. The printing screen unit of claim 1, wherein at least ones of the edges of the sheet have an attachment element extending along part of the length thereof.

11. The printing screen unit of claim 1, wherein the corner pieces each comprise one of first and second recesses or projections and the ends of the interface members each include the other of recesses or projections, which projections and recesses are engaged such as to provide for coupling of the interface members.

12. The printing screen unit of claim 11, wherein the recesses and projections of the corner pieces and the interface members are configured such as to provide for relative movement of the interface members on being tensioned by a tensioning mechanism.

13. The printing screen unit of claim 11, wherein at least one of the corner pieces comprises at least first and second coupling members which are configured such as to enable assembly thereof with the projections and recesses of the at least one corner piece and interface members in engagement, thereby enabling assembly of the frame with the interface members thereof attached to the respective edges of the sheet.

14. The printing screen unit of claim 1, wherein the sheet includes a pattern of printing apertures which define a pattern of deposits to be printed thereby.

15. The printing screen unit of claim 1, wherein the sheet is a blank and includes no printing apertures therein.

16. The printing screen unit of claim 1, wherein the interface members each include an attachment section which provides for attachment to the attachment element at a respective edge of the sheet, and an engagement section for engagement to a tensioning mechanism.

17. The printing screen unit of claim 16, wherein the attachment section of each interface member includes an attachment surface which in use is attached to the attachment element at a respective edge of the sheet.

18. The printing screen unit of claim 17, wherein the attachment surface of each interface member is inclined inwardly from a free edge of the attachment surface relative to the respective edge of the sheet.

19. The printing screen unit of claim 16, wherein the engagement section of each interface member includes an engagement surface for engagement to a tensioning mechanism.

20. The printing screen unit of claim 19, wherein the engagement surface of each interface member is inclined outwardly from a free edge of the engagement surface relative to the respective edge of the sheet.

21. The printing screen unit of claim 1, wherein the sheet is a stainless steel sheet.

* * * * *